United States Patent
Yasui

(10) Patent No.: US 6,594,788 B1
(45) Date of Patent: Jul. 15, 2003

(54) METHOD OF ANALYZING A RELIEF OF FAILURE CELL IN A MEMORY AND MEMORY TESTING APPARATUS HAVING A FAILURE RELIEF ANALYZER USING THE METHOD

(75) Inventor: Takahiro Yasui, Tokyo (JP)

(73) Assignee: Advantest Corporation, Tokyo (JP)

( * ) Notice: Subject to any disclaimer, the term of this patent is extended or adjusted under 35 U.S.C. 154(b) by 341 days.

(21) Appl. No.: 09/617,456

(22) Filed: Jul. 17, 2000

(30) Foreign Application Priority Data

Jul. 16, 1999 (JP) .......................................... 11-203578

(51) Int. Cl.⁷ .............................................. G11C 29/00
(52) U.S. Cl. ...................................... 714/710
(58) Field of Search ................. 714/710, 711

(56) References Cited

U.S. PATENT DOCUMENTS 6,032,264 A * 2/2000 Beffa et al. ..................... 714/7
6,067,259 A * 5/2000 Handa et al. ................. 365/200
6,085,334 A * 7/2000 Giles et al. ................... 714/30

* cited by examiner

Primary Examiner—Albert Decady
Assistant Examiner—Esaw Abraham
(74) Attorney, Agent, or Firm—David N. Lathrop, Esq.; Gallagher & Lathrop

(57) ABSTRACT

A method of analyzing a repair of failure memory cell in a memory is provided, which is capable of searching a must-repair of a memory at high speed and of performing a simulation process for relieving a must-repair at high speed at the time point when it has been detected. There are provided a row address failure number counter/memory for counting the number of failure memory cells on each row address in the row address direction and storing it and a column address failure number counter/memory for counting the number of failure memory cells on each column address in the column address direction and storing it. The stored value in either one counter/memory is read out and the number of failure memory cells on each address is compared with the number of spare lines. The state that the number of failure memory cells on each address is greater than the number of spare lines is determined to be a must-repair, and a simulation process for relieving the failure is executed at the time point when the must-repair has been detected.

9 Claims, 6 Drawing Sheets

METHOD OF ANALYZING A RELIEF OF FAILURE CELL IN A MEMORY AND MEMORY TESTING APPARATUS HAVING A FAILURE RELIEF ANALYZER USING THE METHOD

BACKGROUND OF THE INVENTION

1. Field of the Invention

The present invention relates to a memory testing apparatus for testing various kinds of semiconductor memories including a memory being constructed by, for example, a semiconductor integrated circuit (hereinafter, referred to as IC) and a method of analyzing a relief or repair of failure cell or cells in a memory, which includes the steps of counting the number of failure memory cells of a semiconductor memory tested by this memory testing apparatus and determining whether or not a repair of the tested semiconductor memory is possible. (Hereinafter, a memory being constructed by a semiconductor integrated circuit is referred to as IC memory.) More particularly, the present invention relates to a method of analyzing a repair of failure cell or cells in a memory, which includes the step of determining whether or not a repair of failure called in this technical field "must-repair" in a memory of redundancy structure can be carried out and a memory testing apparatus having a failure relief analyzer using this analyzing method.

2. Description of the Related Art

In recent years, increase of memory capacity and miniaturization of an IC memory have been attempted. Associated with the increased memory capacity and the miniaturization of an IC memory, defect rates of IC memories have been increased. In order to decrease the defect rates, in other words, in order to prevent the yield from being decreased, there have been manufactured, for example, IC memories in each of which failure memory cells can be electrically replaced with spare memory cells (referred to as spare lines, relief lines or a redundancy circuit in this technical field). The IC memories of this type each having spare memory cells are called, in this technical field, memories having redundancy structure, and the determination as to whether or not a relief of failure memory cells of a memory having redundancy structure is possible is performed by a failure relief analyzer. Recently, storage capacity of an IC memory is increasing more and more, and accordingly an increased IC chip area and formation of patterns at high density are required. As a result, there is an increased possibility that a reduction of the yield of IC memories caused by a very minute defect occurs. In order to prevent the yield of IC memories from being reduced, there are manufactured IC memories in each of which, for example, one or more failure memory cells can be electrically replaced by a substitute or alternative memory cell (also called a spare line, relief line or redundancy circuit). As will be described later, the IC memory of this kind is called a memory of redundancy structure in this technical field, and a decision as to whether the redundancy-structured memory can be relieved or not is rendered by a failure relief analyzer.

FIG. 5 is a block diagram showing a schematic configuration of an example of a memory testing apparatus having a conventional failure relief analyzer. This memory testing apparatus TES comprises, roughly speaking, a main controller 111, a pattern generator 112, a timing generator 113, a waveform formatter 114, a logical comparator 115, a driver 116, an analog level comparator (hereinafter referred to as a comparator) 117, a failure analysis memory 118, a failure relief analyzer 120, a logical amplitude reference voltage source 121, a comparison reference voltage source 122 and a device power source 123. Further, in the following description, a case of testing an IC memory will be described. However, various semiconductor memories other than IC memories are similarly tested.

The main controller 111 is generally constituted by a computer system in which a test program PM created by a user (programmer) is loaded in advance, and the control of the entire memory testing apparatus is performed in accordance with the test program PM. This main controller 111 is connected, via a tester bus BUS, to the pattern generator 112, the timing generator 113, the failure analysis memory 118, the failure relief analyzer 120 and the like. Although not shown, the logical amplitude reference voltage source 121, the comparison reference voltage source 122 and the device power source 123 are also connected to the main controller 111.

An IC memory to be tested (IC memory under test, generally referred to as MUT) 119 is mounted on a socket of a test head (not shown) constructed separately from the memory testing apparatus proper. Usually, a member called a performance board is mounted on the upper portion of the test head, and a predetermined number of IC sockets are mounted on the performance board. Therefore, the IC memory under test 119 is mounted on related one of the IC sockets. In addition, a printed-circuit board called pin card in this technical field is accommodated inside the test head. Usually, a circuit containing the driver 116 and the comparator 117 of the memory testing apparatus TES is formed on this pin card. In general, the test head is mounted on a test section of an IC transporting and processing apparatus called handler in this technical field, and is electrically connected to the memory testing apparatus proper by signal transmission means such as a cable, an optical fiber or the like.

First of all, before starting the test of the IC memory, various kinds of data are set by the main controller 111. After the various kinds of data have been set, the test of the IC memory is started. When the main controller 111 issues a test starting command to the pattern generator 112, the pattern generator 112 starts to generate a pattern. The pattern generator 112 supplies a test pattern data to the waveform formatter 114 in accordance with the test program PM. On the other hand, the timing generator 113 generates a timing signal (clock pulses) for controlling operation timings of the waveform formatter 114, the logical comparator 115 and the like.

The waveform formatter 114 converts the test pattern data supplied from the pattern generator 112 into a test pattern signal having a real waveform. This test pattern signal is applied to the IC memory under test (hereinafter referred to as memory under test) 119 via the driver 116 that amplifies the voltage of the test pattern signal to a waveform having an amplitude value set by the logical amplitude reference voltage source 121. The test pattern signal is stored in a memory cell of the memory under test 119 having an address specified by an address signal, and the storage content is read out therefrom during a read cycle later on.

A response signal read out from the memory under test 119 is compared with a reference voltage supplied from the comparison reference voltage source 122 in the comparator 117, and it is determined whether or not the response signal has a predetermined logical level, i.e., whether or not the response signal has a predetermined logical H (logical high) voltage or logical L (logical low) voltage. A response signal determined to have the predetermined logical level is sent to the logical comparator 115, where the response signal is compared with an expected value pattern signal, and whether or not the memory under test 119 has outputted a normal response signal is determined.

If the response signal is not equal to the expected value pattern signal, a memory cell having an address of the memory under test 119 from which the response signal was read out is determined to be in failure, and a failure signal indicating the failure is generated from the logical comparator 115. Usually, when a failure signal is generated, a writing of a failure data (generally logical "1" signal) applied to a data input terminal of the failure analysis memory 118 is enabled, and the failure data is stored in an address of the failure analysis memory 118 specified by an address signal being supplied to the failure analysis memory 118 at that time.

The failure analysis memory 118 has an operation speed and a memory capacity equivalent to those of the memory under test 119. An address signal that is same as the address signal applied to the memory under test 119 is applied to this failure analysis memory 118. In addition, the failure analysis memory 118 is initialized prior to starting the test. For example, a data of "0" is written, by the initialization, in each of all the addresses of the failure analysis memory 118. Every time a failure signal indicating a discordance between the response signal and the expected value pattern signal is generated from the logical comparator 115 in the test of the memory under test 119, a failure data of logical "1" indicating a memory cell failure is written in the same address of the failure analysis memory 118 as that of the memory cell of the memory under test 119 in which the discordance is detected.

On the contrary, when the response signal is equal to the expected value pattern signal, a memory cell of the address of the memory under test 119 from which the response signal was read out is determined to be normal, and a pass signal indicating the normal memory cell is generated. This pass signal is not usually stored in the failure analysis memory 118.

At the time point when the test is completed, the failure data stored in the failure analysis memory 118 are read out therefrom into the failure relief analyzer 120, and it is determined whether or not a relief of failure memory cells of the tested IC memory 119 is possible.

The failure relief analyzer 120 simultaneously and separately counts the total number of failure memory cells and the number of failure memory cells on each of row address lines and column address lines stored in the failure analysis memory 118, and analyzes Whether or not those failure memory cells can be relieved by the spare lines provided for each of a plurality of storage areas (memory cell array) of the memory under test 119.

Further, in FIG. 5, the block diagram is depicted such that the test pattern signal outputted from the driver 116 is applied to only one input terminal of the memory under test 119, and a response signal from one output terminal of the memory under test 119 is supplied to the comparator 117. However, the number of drivers 116 provided is actually equal to the number of input terminals of the memory under test 119, for example 512, and the number of comparators 117 provided is also equal to the number of output terminals of the memory under test 119 (since the number of input terminals provided is usually equal to the number of output terminals, the number of comparators 117 provided is equal to the number of drivers 116 provided). In addition, although the input terminals of the memory under test 119 are depicted, in FIG. 5, as separate terminals from the output terminals of the memory under test 119, there are many cases in general where each terminal of the memory under test 119 is commonly used for both input terminal and output terminal. Moreover, although each of the elements (the main controller 111, the pattern generator 112, the timing generator 113, the waveform formatter 114, the logical comparator 115, the failure analysis memory 118, the failure relief analyzer 120 and the like) except for the driver 116 and the comparator 117 is represented by one block, there are also actually provided in each block the same number of elements as that of the drivers 116 (for example, 512) except for the main controller 111 and the timing generator 112. That is, only the main controller 111 and the timing generator 112 are commonly used for the terminals of the memory under test 119.

FIG. 6 shows the internal structure of the memory under test 119. An IC memory constituted by a semiconductor integrated circuit has a plurality of storage areas 2 formed on the same semiconductor chip 1. Each storage area 2 is constituted by many memory cells aligned along row address lines and column address lines, and is called a memory cell array (MCA) in this technical field. A memory element having desired storage capacity is constituted by the plurality of storage areas 2. In addition, each of the plurality of storage areas 2 is selectively accessed by a storage area (block) address signal that is to be described later on.

As shown in FIG. 7 in enlarged form, each storage area 2 has a memory cell array MCA in which memory cells have been arrayed in a matrix manner of rows and columns, and in addition to the memory cell array MCA, is provided with a desired number of row spare lines SR and a desired number of column spare lines SC formed in the row address direction ROW and in the column address direction COL along the periphery of the memory cell array MCA, respectively. These spare lines SR and SC are provided for the purpose of relieving failure memory cells, and serve to change a memory under test that has been determined to be a defective or failure article to a non-defective or pass article by electrically replacing the detected failure memory cells in the storage area 2 with those spare lines. Further, in this example, a case is shown where two row spare lines SR are disposed along one side of the row address direction of the memory cell array MCA and two column spare lines SC are disposed along one side of the column address direction of the memory cell array MCA, respectively. However, it is needless to say that the number of spare lines and the positions where these spare lines are disposed are not limited to the example as illustrated.

The number of failure memory cells that can be relieved by the spare lines orthogonal to address line directions in the storage area 2 is restricted by the number of the spare lines SR formed in the row address direction ROW and the number of spare lines SC formed in the column address direction COL. For this reason, after the test is completed, at first the number of failure memory cells is obtained for each storage area 2, and row address lines and column address lines on which these failure memory cells are present are located for each storage area 2 to determine whether or not those failure memory cells on those address lines can be relieved by the spare lines orthogonal to their respective address lines.

The failure relief analyzer 120 includes, as shown in FIG. 8, a row address failure number counter/memory RFC for counting and storing therein the number of failure memory cells present on each of the row address lines in each storage area 2, a column address failure number counter/memory CFC for counting and storing therein the number of failure memory cells present on each of the column address lines in each storage area 2, and a total failure number counter/memory TFC for counting and storing therein the total number of failure memory cells in each storage area 2. Further, the row address failure number counter/memory RFC and the column address failure number counter/memory CFC are constructed in reality such that those counters/memories RFC and CFC count the number of failure data read out from the failure analysis memory 118 each representing a failure memory cell in each of the row address line and column address line, respectively, and the counted values are stored in their respective failure storing memories. The total failure number counter/memory TFC is constructed such that the total failure number counter/memory TFC accumulates, each time a failure data is read out from the failure analysis memory 118, the number of failure occurrences, and the accumulated value is stored in the total failure storing memory of the total failure number counter/memory TFC.

As an occurrence state of failure memory cells, there is a case in which, as shown in FIG. 9, many failure cells FC are present on one row address line RLN or on one column address line CLN. A state that the number of failure memory cells FC on one address line is larger than the number of spare lines provided in the direction orthogonal to their address line RLN or CLN is generally called a must-repair MS in this technical field. This must-repair MS cannot be repaired by the spare lines provided in the direction orthogonal to its address line RLN or CLN. Therefore, it is necessary to relieve such a must-repair using a spare line SR or SC that is provided in parallel to the must-repair address line RLN or CNL. As a failure relief analyzing procedure, the must-repair MS must be first detected. Then, the spare line used for the repair of the must-repair MS and the repaired failure memory cells are excluded from the consideration for further failure relief, and thereafter it is determined whether or not the remaining failure memory cells can be relieved by the remaining spare lines.

A must-repair MS is searched in both row address direction ROW and column address direction COL. Specifically explaining, first, when the storage content of the row address failure number counter/memory RFC is read out in the row address sequence, the number of failure memory cells present on each row address line of each storage area 2 can be read out. The number X1 of failure memory cells stored in each of the row addresses is compared with the number Y1 of column spare lines SC. If the comparison result is X1>Y1, the row address line is determined to be in must-repair state. The row address determined to be in must-repair state is sent to the main controller 111, and is stored in the main controller 111 as a row must-repair address.

Next, the storage content of the column address failure number counter/memory CFC is read out in the column address sequence to read out the number of failure memory cells present on each column address line of each storage area 2. The number X2 of failure memory cells stored in each of the column addresses is compared with the number Y2 of row spare lines SR. If the comparison result is X2>Y2, the column address line is determined to be in must-repair state. The column address determined to be in must-repair state is sent to the main controller 111, and is stored in the main controller 111 as a column must-repair address.

When the searching operation of must-repair addresses has been completed, the main controller 111 sets the stored row and column must-repair addresses in the failure relief analyzer 120, and makes the failure relief analyzer 120 perform a data updating operation. A must-repair MS cannot be repaired unless one spare line that is in parallel with the must-repair address line is used. Therefore, if a must-repair MS is present only on one row address line RLN, for example, one row spare line SR must be used. As a result, if a must-repair MS is present only on one row address line RLN, there is performed an operation of decreasing the number of row address lines SR by one as well as subtracting the number of failure memory cells on the row address line on which the must-repair MS is present from each of the row address failure number counter/memory RFC, column address failure number counter/memory CFC and the total failure number counter/memory TFC. By this operation, the memory under test 119 will be repaired to a non-defective article for the present.

Even if only one must-repair address is present on one of row addresses, the number of row spare lines is decreased by one. Therefore, the number of row spare lines SR is changed. As a result, regarding column address lines that are orthogonal to the row spare line SR, a searching operation for a must-repair must be performed again with respect to the changed number of row spare lines SR. The search condition in this case is to compare the number X2 of failure memory cells of each column address with Y2−1 that is a number resulted by subtracting one (1) from the number Y2 of row spare lines SR. If the comparison result X2>Y2−1 is detected, the corresponding column address is sent to the main controller 111 as a column must-repair address, and is stored therein.

When the searching operation of must-repair addresses in the column address direction COL is completed, the main controller 111 sets again the column must-repair addresses detected with respect to column addresses in the failure relief analyzer 120, and makes the failure relief analyzer 120 perform a data updating operation. If, for example, a must-repair MS is present only on a column address line CLN, it is deemed that one column spare line SC has been used, and 1 is subtracted form the number of column spare lines SC. Moreover, the number of failure memory cells on the column address line on which the must-repair MS is present is subtracted from each of the row address failure number counter/memory RFC, column address failure number counter/memory CFC and the total failure number counter/memory TFC. By this operation, the memory under test 119 is changed to a non-defect article again.

Since the number of column spare lines SC is decreased by one by this updating operation, a searching operation for a must-repair must be performed again this time with respect to row address lines that are orthogonal to the column spare line SC. In this manner, the searching operation of a must-repair and the updating operation of the analysis data are repeated until any must-repair is not detected.

As mentioned above, in the prior art system, the failure relief analyzer 120 operates under control of the main controller 111. Therefore, the main controller 111 sets first in the failure relief analyzer 120 a storage area to be relieved and the numbers of row spare lines SR and column spare lines SC, and then makes the failure relief analyzer 120 continuously perform the must-repair searching operation for the set storage area until the last addresses in the row address direction ROW and the column address direction COL are generated. When the failure relief analyzer 120 detects a must-repair, the main controller 111 stores therein its address. Upon completion of the must-repair searching operation by the failure relief analyzer 120 with respect to the row address direction and the column address direction, the main controller 111 updates analysis data set in the failure relief analyzer 120. Then the main controller 111 makes the failure relief analyzer 120 perform again the must-repair searching operation based on the updated analysis data. After that, whenever a must-repair is detected, the main controller 111 makes the failure relief analyzer 120 perform the must-repair operation with respect to the other address direction that is different from the address direction of the detected must-repair (if the address of the detected must-repair is a row address, the other address direction is the column address direction). This must-repair searching operation is performed until any must-repair is not detected.

For this reason, the main controller 111 repeats many times the operations of setting the storage areas to be relieved and the numbers of row and column spare lines SR and SC, acquiring must-repair addresses, and reading out the acquired must-repair addresses to set them in the failure relief analyzer 120 and to update the number of spare lines SR and SC. In addition, the failure relief analyzer 120 repeats many times the must-repair searching operation and the operation of subtracting the number of failure memory cells on the address line on which the must-repair is present from the row address failure number counter/memory RFC, the column address failure number counter/memory CFC and the total failure number counter/memory TFC. In this manner, the acquiring and reading operations of the must-repair addresses, the setting and updating operations of analysis data, and the subtracting operations of the numbers of failures are repeated many times, and hence it takes long time for those operations. As a result, there is a disadvantage in the prior art system that it takes, as a whole, a long time for the must-repair searching operations.

In addition, in the prior art system, at least one must-repair searching operation must be performed with respect to row address direction ROW and column address direction COL for the storage area 2 where there is no failure memory cell. This fact is also one of factors of taking long time in the failure relief analysis.

In recent years, there has been a tendency that the storage capacity of a memory under test is increasing, and the number of storage areas to be relieved and the area of each of the storage areas are increased. Therefore, the must-repair searching time has increased more and more. For this reason, there is a drawback in the prior art system that the test time of an IC memory is long.

SUMMARY OF THE INVENTION

It is a first object of the present invention to provide a method of analyzing a relief of failure cells in a memory, which is capable of completing a failure relief analysis in a short time even if a memory under test has many storage areas.

It is a second object of the present invention to provide a memory testing apparatus having a failure relief analyzer using the above method of analyzing a relief of failure cells.

It is a third object of the present invention to provide a method of analyzing a relief of failure cells in a memory, which is capable of completing in a short time a must-repair address searching operation and an updating operation of data due to the repair of a must-repair.

It is a fourth object of the present invention to provide a memory testing apparatus having a failure relief analyzer using the method of analyzing a relief of failure cells described in the above third object of the present invention.

In order to accomplish the aforesaid objects, there is provided, in one aspect of the present invention, a method of analyzing a repair of failure cell in a memory comprising the steps of: testing a memory having a plurality of storage areas; detecting whether or not the number of failure memory cell on a row or column address line of each of the storage areas is greater than the number of spare line for relieving a failure, said spare line being provided in orthogonal direction to said row or column address line; determining, when the number of failure memory cell is greater than the number of spare line, the failure memory cell to be "must-repair"; and assuming that the failure memory cell on the address line determined to be the "must-repair" has been repaired by use of the spare line and updating data in such state that said "must-repair" has been repaired, said method further comprising the steps of: carrying out, each time a "must-repair" is detected on a row address or column address, an updating process of said data at the position of the row address or column address from which the "must-repair" has been detected; and continuing to search a "must-repair" after the updating process of the data has completed.

In another aspect of the present invention, there is provided a memory testing apparatus for testing a memory having a plurality of storage areas and at least one spare line for relieving a failure provided on each of said storage areas, said apparatus having a failure relief analyzer for counting, each storage area, the total number of failure memory cells, the number of failure memory cell on each row address, and the number of failure memory cell on each column address, respectively, and analyzing a method of repairing the failure memory cells for each storage area, and comprising: an analyzed storage area detector for searching whether a failure memory cell exists or not on each storage area and determining whether a failure relief analysis for the storage area should be carried out or not; a memory for storing the number of spare lines, said memory storing the number of spare line provided in row address direction and the number of spare line provided in column address direction of each storage area, respectively; a must-repair searching-apparatus for comparing the number of spare line stored in said number of spare line storing memory with the number of failure memory cell on a row address line or column address line of each storage area, detecting a state that the number of failure memory cell is greater than the number of spare line provided in orthogonal direction to the address line and determining the detected state to be a must-repair; data updating apparatus for carrying out, each time said must-repair searching apparatus detects a must-repair, a process of updating data to such state that failure memory cells on the address line of the detected must-repair have been repaired by use of the spare line; a re-starting apparatus for detecting the end of the data updating process carried out by said data updating apparatus and re-starting said must-repair searching apparatus; must-repair search resuming means detecting the fact that said data updating apparatus has operated and causing a search of must-repair to be resumed, under the condition that the number of updated spare line by the simulation process of the data updating apparatus is used in detecting a must-repair; and search ending means detecting the fact that no must-repair is detected during the search of a must-repair and ending the search of a must-repair for the storage area being analyzed.

In a preferred embodiment, the aforesaid analyzed storage area detector comprises: a storage area address generator for generating addresses given to said plurality of storage areas; a total failure number counter/memory for storing the total number of failure memory cells for each storage area, said total failure number counter/memory being accessed by a storage area address signal outputted from said storage area address generator and outputting the total number of failure memory cells of the corresponding storage area; zero detecting means detecting the fact that the total number of failure memory cells read out of said total failure number counter/memory is "0"; means incrementing the address outputted from said storage area address generator each time said zero detecting means detects "0"; and means starting said must-repair searching apparatus in case that the total number of failure memory cells read out of said total failure number counter/memory is a numerical value other than "0".

The aforesaid spare line number storing memory comprises: a memory for storing the number of spare line provided in the row address direction; and a memory for storing the number of spare line provided in the column address direction, said memories being accessed by a storage area address signal outputted from said storage area address generator and outputting the number of spare line prepared on the corresponding storage area, respectively.

The aforesaid must-repair searching apparatus comprises: a row address failure number counter/memory for storing the number of failure memory cells on each row address line for each storage area; a column address failure number counter/memory for storing the number of failure memory cells on each column address line for each storage area; a row address generator for accessing said row address failure number counter/memory; a column address generator for accessing said column address failure number counter/memory; a first comparator for comparing the number of failure memory cells on each row address line read out of said row address failure number counter/memory with the number of spare line provided in orthogonal direction to the row address line and detecting a must-repair on the row address line; and a second comparator for comparing the number of failure memory cells on each column address line read out of said column address failure number counter/memory with the number of spare line provided in orthogonal direction to the column address line and detecting a must-repair on the column address line.

The aforesaid data updating apparatus comprises: a controller for performing a control which prevents said row address generator or column address generator under incrementing operation from doing the incrementing operation, and a control which increments said column address generator or row address generator having paused in operation from the first address to the last address, during a search of a must-repair by a detection signal that said must-repair searching apparatus has detected either one of a must-repair on a row address line or a must-repair on a column address line; a first subtracter for updating the number of spare line by assuming that one spare line has been used for relieving the detected must-repair and setting the updated number of spare line in said memory for storing the number of spare lines; a second subtracter for performing a subtraction of "1" from the total number of failure memory cells of the corresponding storage area outputted from said total failure number counter/memory each time a failure memory cell is read out from said row address failure number counter/memory or column address failure number counter/memory read out by the incrementing operation of said row address generator or column address generator which has started to do its incrementing operation, and setting the result of the subtraction in said total failure number counter/memory; and third and fourth subtracters for performing a subtraction of "1" from the number of failure memory cells of the corresponding storage area outputted respectively from said row address failure number counter/memory and said column address failure number counter/memory each time a failure memory cell is read out respectively from said row address failure number counter/memory and column address failure number counter/memory, and setting the result of the subtractions in said row address failure number counter/memory and said column address failure number counter/memory, respectively.

The aforesaid re-starting apparatus comprises: a pair of carry selectors for detecting the facts that the row address signal and column address signal outputted respectively from said row address generator and said column address generator have reached their last addresses, respectively; and a controller receiving carry signals outputted from these carry selectors and performing a control which resumes the incrementing operation of said row address generator or said column address generator having paused in operation.

The aforesaid must-repair search resuming means comprises: control means for performing a control which detects a coincidence between the condition that said must-repair searching apparatus detects the presence of a must-repair on either one of the row address direction or column address direction, and said data updating apparatus operates to update the number of spare line stored in said memory for storing the number of spare lines and the condition that the search operation for a must-repair has completed, and causing a search operation for a must-repair on the one address direction using the updated number of spare line as the detecting condition of a must-repair to be executed.

The aforesaid search ending means comprises: means detecting a completion of two conditions that the address generated from said storage area address generator has reached the last address and that said must-repair searching apparatus has ended the search operation for a must-repair on the row address direction or column address direction without detecting any must-repair.

The method of analyzing a repair of failure cell or cells in a memory and the failure relief analyzer using this analyzing method according to the present invention are characterized in the construction which comprises: a total failure number counter/memory for storing the total number of failure memory cells in each storage area of a memory under test, a spare line number storing memory for storing the number of spare lines provided in the row address direction and in the column address direction, a row address failure number counter/memory and a column address failure number counter/memory for counting the number of failure memory cells occurring at each row address and each column address in each storage area, respectively, and storing them therein, and a must-repair searching apparatus for reading out the number of failures at each address of the row address failure number counter/memory and the column address failure number counter/memory to search a must-repair. By this characterized construction, when the must-repair searching apparatus detects a must-repair, an updating operation for analyzing data can immediately be executed at that address position so that the stored values in each counter/memory can be updated.

Accordingly, in accordance with the present invention, without intervention of the main controller 111, when a must-repair is detected during the search operation of a must-repair, an updating operation of analyzing data is automatically executed. As a result, there is no need to carry out an operation for sequentially setting an address of the detected must-repair and the number of spare line in the failure relief analyzer, and hence the failure relief analysis can be executed in a short time.

DETAILED DESCRIPTION OF THE PREFERRED EMBODIMENTS

Figure 1:
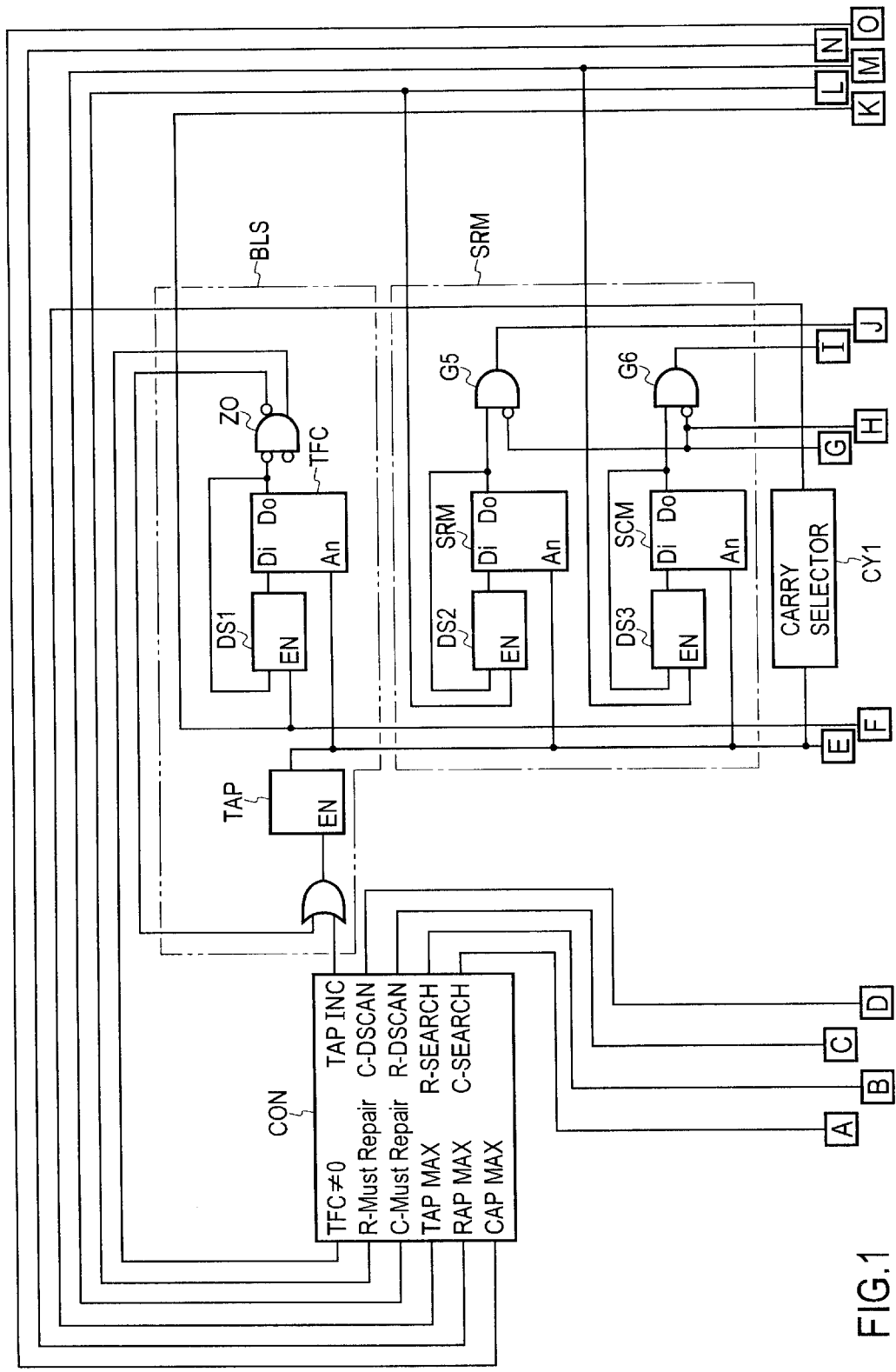
FIG. 1 is a block diagram showing configurations of, mainly, an analyzed storage area detector, a memory for storing the number of spare lines, and a controller in an embodiment of the failure relief analyzer used in a memory testing apparatus according to the present invention.
Figure 2:
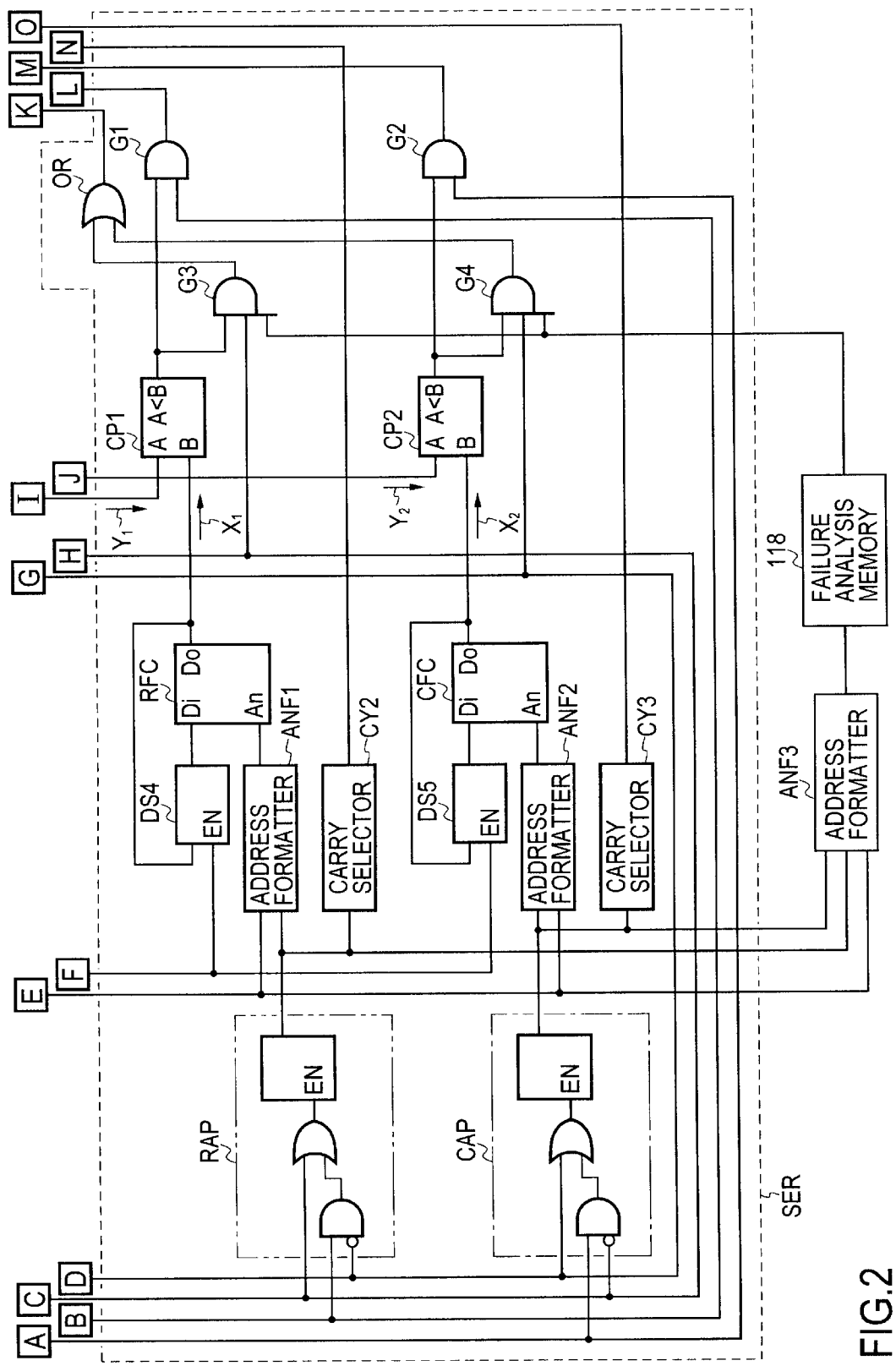
FIG. 2 is a block diagram showing a configuration of, mainly, a must-repair searching apparatus in an embodiment of the failure relief analyzer used in the memory testing apparatus according to the present invention.

First, an embodiment of the failure relief analyzer used in a memory testing apparatus according to the present invention will be described in detail with reference to FIGS. 1 and 2. FIGS. 1 and 2 show, as a whole, the configuration of the failure relief analyzer by interconnecting terminals "A" to "O" shown in FIG. 1 with terminals "A" to "O" shown in FIG. 2, respectively.

FIG. 1 shows configurations of, mainly, an analyzed storage area detector BLS, a memory for storing the number of spare lines (also referred to as spare line number storing memory) SPM, and a controller CON, respectively, and FIG. 2 shows a configuration of, mainly, a must-repair searching apparatus SER.

Figure 5:
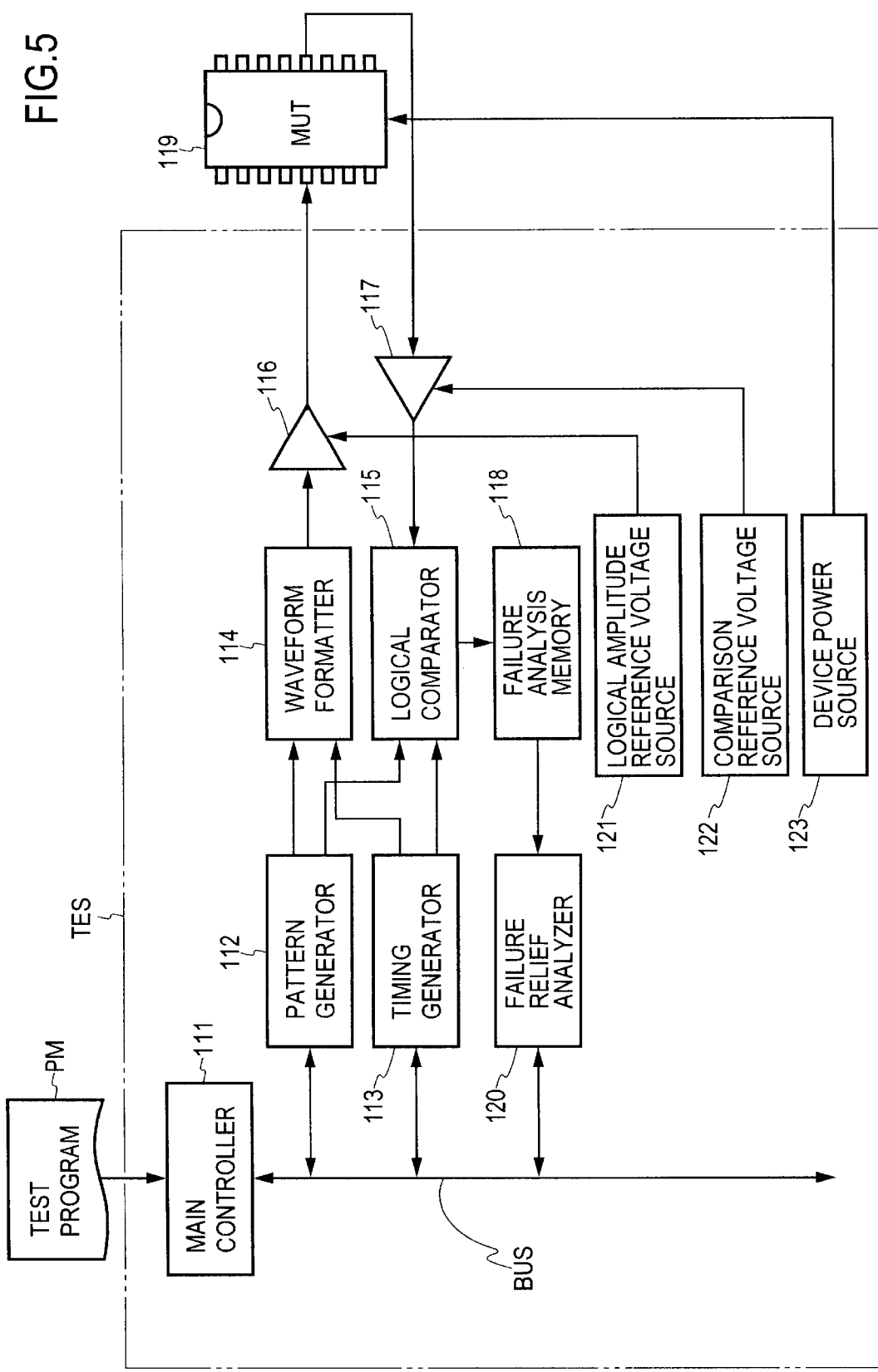
FIG. 5 is a block diagram showing a general configuration of a conventional memory testing apparatus.
Figure 6:
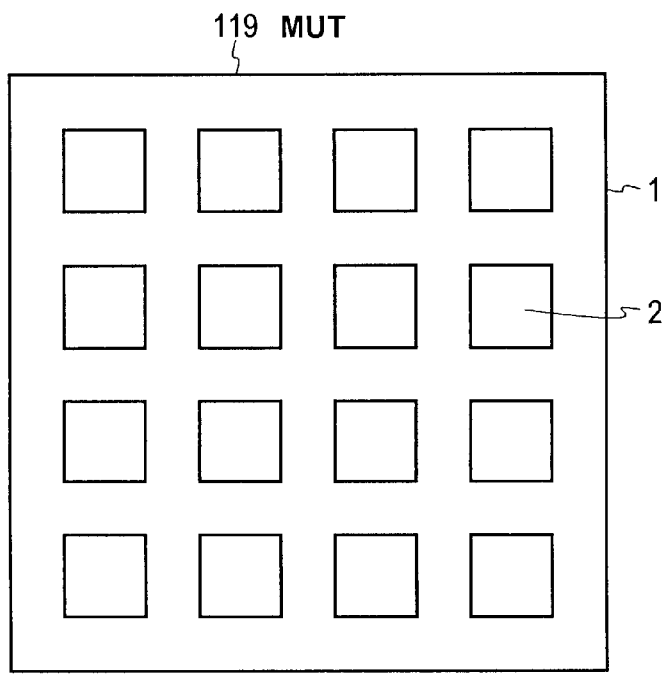
FIG. 6 is an enlarged plan view for explaining an example of the internal structure of a redundancy-structured memory under test.
Figure 8:
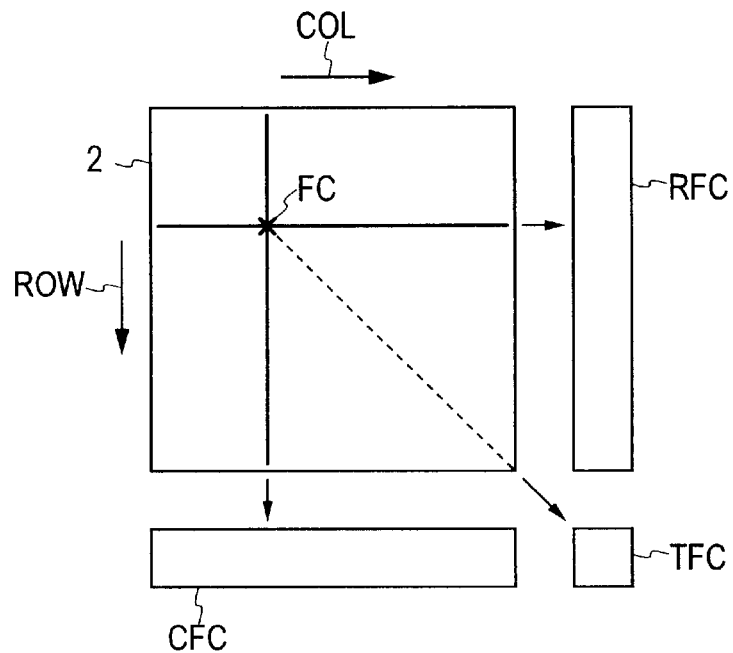
FIG. 8 is a diagram for explaining the counting operation of failure memory cells performed in the failure relief analyzer shown in FIG. 5.

The analyzed storage area detector BLS is an apparatus for detecting a storage area 2 to be analyzed in the memory under test 119 (see FIGS. 5 and 6), and comprises the total failure number counter/memory TFC shown in FIG. 8, a storage area address generator TAP, and a zero detector ZO. As mentioned above, the total number of failure memory cells in each of the storage areas 2 of the memory under test 119 is stored in the total failure number counter/memory TFC. Further, a first subtractor DS1 shown in a broken line that indicates the analyzed storage area detector BLS is an element belonging to a data updating apparatus to be described later on, and is merely shown in the analyzed storage area detector BLS for reason of convenience.

Figure 7:
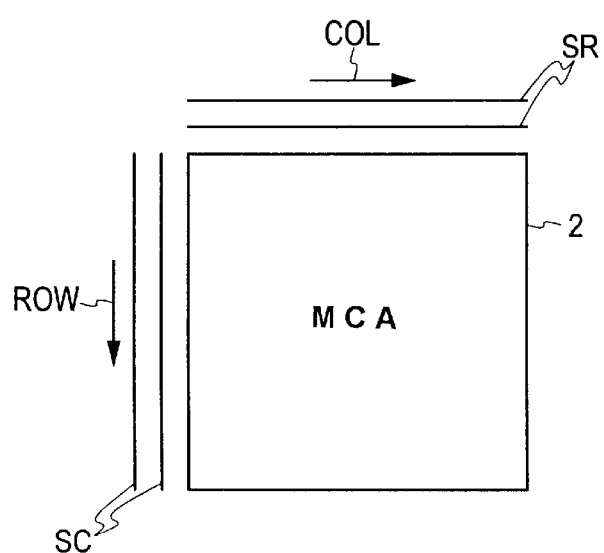
FIG. 7 is an enlarged plan view showing one of the storage areas of the redundancy-structured memory under test shown in FIG. 6.

The memory SPM for storing the number of spare lines comprises a row spare line memory SRM for storing therein the number of row spare lines SR (see FIG. 7) provided on each storage area 2 of the memory under test 119 and a column spare line memory SCM for storing therein the number of column spare lines SC (see FIG. 7) provided on each storage area 2. Further, a second and a third subtractors DS2 and DS3 shown in a broken line that indicates the spare line number storing memory SPM are also elements belonging to the data updating apparatus to be described later on, and are merely shown in the spare line number storing memory SPM for reason of convenience.

Figure 9:
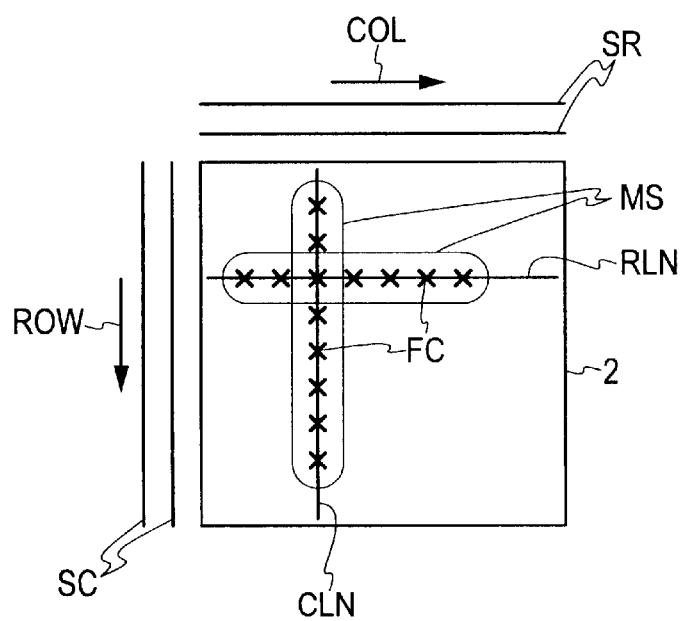
FIG. 9 is an enlarged plan view for explaining a must-repair relieving method performed in the failure relief analyzer shown in FIG. 5.

The must-repair searching apparatus SER is an apparatus for searching a must-repair MS (see FIG. 9) present in the memory under test 119, and includes a row address generator RAP, a column address generator CAP, an RFC address formatter ANF1, a CFC address formatter ANF2, the row address failure number counter/memory RFC shown in FIG. 8, the column address failure number counter/memory CFC shown in FIG. 8, a first comparator CP1 for searching a must-repair with respect to row addresses, and a second comparator CP2 for searching a must-repair with respect to column addresses. As mentioned above, the numbers of failure memory cells on row address lines of each storage area 2 of the memory under test 119 are stored in the row address failure number counter/memory RFC, and the numbers of failure memory cells on column address lines of each storage area 2 of the memory under test 119 are stored in the column address failure number counter/memory CFC. Further, a fourth and a fifth subtractors DS4 and DS5 shown in a broken line that indicates a must-repair searching apparatus SER are also elements belonging to the data updating apparatus to be described later on, and are merely shown in the must-repair searching apparatus SER for reason of convenience.

As mentioned before with reference to FIGS. 6 and 7, in the total failure number counter/memory TFC, the total numbers of failure memory cells detected in respective storage areas of the memory under test 119 are stored in addresses corresponding to these storage areas. The storage area address generator TAP generates an address signal for specifying each storage area 2. An address signal generated by the storage area address generator TAP is inputted to an address input terminal An of the total failure number counter/memory TFC, and the total number of failure memory cells in the corresponding storage area is read out from the address of the total failure number counter/memory TFC specified by the address signal.

The total number of failure memory cells read out from the total failure number counter/memory TFC is inputted to the zero detector ZO. This zero detector ZO determines whether the number of failure memory cells is "0" or a number other than "0".

If the total number of failure memory cells read out from the total failure number counter/memory TFC is "0", it is not necessary to perform the relief analysis for the storage area 2 corresponding to the inputted address signal. Therefore, a signal indicating this is sent from the zero detector ZO to the storage area address generator TAP. Then the storage area address generator TAP increments the address by one to generate the next address signal, and supplies the generated address signal to the address input terminal An of the total failure number counter/memory TFC. This operation is repeated during the time when "0s" are continuously read out from the total failure number counter/memory TFC.

If the total number of failure memory cells read out from the total failure number counter/memory TFC is a number other than "0", there is a possibility that a must-repair is present. Therefore, it is necessary to temporarily stop of the storage area address generator TAP. The address incrementing operation is herein defined to be an operation for incrementing the address of storage area by one in the sequential order from the starting address to the last address to generate an address signal. For this reason, if the total number of failure memory cells read out from the total failure number counter/memory TFC is a numerical value other than "0", a detection signal TFC ≠0 is sent from the zero detector ZO to the controller CON. Based on this detection signal, the controller CON supplies a control signal to the storage area address generator TAP. Hence, the storage area address generator TAP stops its address incrementing operation and is held in the state that the storage area address generator TAP is outputting an address signal corresponding to the current storage area.

A storage area address signal is also supplied to the memories other than the total failure number counter/memory TFC. Specifically explaining, a storage area address signal is directly supplied to the respective address input terminals An of the row spare line memory SRM and the column spare line memory SCM of the spare line number storing memory SPM, and is supplied to the respective address input terminals An of the row address failure number counter/memory RFC and the column address failure number counter/memory CFC in the must-repair searching apparatus SER via the RFC address formatter ANF1 and the CFC address formatter ANF2, respectively. Therefore, the numbers of row and column spare lines of the corresponding storage area are read out from the respective addresses of the row spare line memory SRM and the column spare line memory SCM specified by the respective address signals.

The RFC address formatter ANF1 formats (combines) a row address signal outputted from the row address generator RAP and a storage area address signal outputted from the storage area address generator TAP to output an RFC address signal, and accesses the row address failure number counter/memory RFC using the RFC address signal. An RFC address signal is an address signal for specifying one of the rows in one of the storage areas, and comprises a storage area address signal and a row address signal of the specified storage area.

The CFC address formatter ANF2 formats a column address signal outputted from the column address generator CAP and a storage area address signal outputted from the storage area address generator TAP to output a CFC address signal, and accesses the column address failure number counter/memory CFC using the CFC address signal. A CFC address signal is an address signal for specifying one of the columns in one of the storage areas, and comprises a storage area address signal and a column address signal of the specified storage area. Therefore, the numbers of failure memory cells on the row address lines and the numbers of failure memory cells on the column spare lines of the corresponding storage area are read out from the respective addresses of the row address failure number counter/memory RFC and the column address failure number counter/memory CFC specified by the address signal.

The row address generator RAP increments by one the row address form the starting address to the last address, and generates row address signals corresponding to respective row addresses to supply these row address signals to the RFC address formatter ANF1. By these row address signals, the numbers of failure memory cells of corresponding row address lines of each storage area 2 are read out from the row address failure number counter/memory RFC.

The column address generator CAP increments by one the column address form the starting address to the last address, and generates column address signals corresponding to respective column addresses to supply these column address signals to the CFC address formatter ANF2. By these column address signals, the numbers of failure memory cells of corresponding column address lines of each storage area 2 are read out from the column address failure number counter/memory CFC.

A storage address carry selector (carry detector) CY1 is connected to the storage area address generator TAP. A storage area address signal is also supplied to the storage area address carry selector CY1. The storage area address carry selector CY1 detects the fact that the storage area address generator TAP has generated the number of address signals corresponding to the numerical value that the total number of storage areas to be relieved of the memory under test is subtracted by one, that is, has generated the storage area address signal immediately before the last storage area address signal (for example, a signal in which all of the predetermined number of bits constituting an address signal are "1s"), and sends a carry signal TAP MAX to the controller CON. Alternatively, the storage area address carry selector CYI may detect the fact that the storage area address generator TAP has generated all of the storage area address signals corresponding to the total number of the storage areas to be relieved of the memory under test, that is, has generated the last storage area address signal, and send a carry signal TAP MAX to the controller CON.

A row address carry selector CY2 and a column address carry selector CY3 are also connected to the row address generator RAP and the column address generator CAP, respectively. A row address signal is supplied to the row address carry selector CY2, and a column address signal is supplied to the column address carry selector CY3. These carry selectors CY2 and CY3 detect the facts that the corresponding address generators RAP and CAP have generated all of the row address signals and all of the column address signals, respectively, i.e., have generated the last row address signal and the last column address signal (for example, a signal in which all of the predetermined number of bits constituting an address signal are "1s"), respectively, and send carry signals RAP MAX and CAP MAX to the controller CON, respectively.

Further, in this embodiment, there is shown a case in which the failure relief analyzer is constructed such that address signals outputted respectively from the storage area address generator TAP, the row address generator RAP and the column address generator CAP are also supplied to an AFM address formatter ANF3, and when a failure relief analysis is preformed, the failure analysis memory 118 is accessed by an AFM address signal that is obtained by formatting these address signals to read out failure data stored in the failure analysis memory 1118 simultaneously with reading operations of the aforementioned row address failure number counter/memory RFC and column address failure number counter/memory CFC, and then a must-repair searching operation is performed by correlating the failure memory cell addresses stored in the failure analysis memory 118 with the failure memory cell addresses stored in the row address failure number counter/memory RFC and the column address failure number counter/memory CFC. Of course, the present invention is not limited to such configuration.

Next, the must-repair searching operation performed by the failure relief analyzer constructed as mentioned above and the analysis data updating operation performed upon detection of a must-repair will be described.

When the number of failure memory cells read out from the total failure number counter/memory TFC is not "0", the zero detector ZO outputs a detection signal TFC≠0 and inputs the detection signal to the controller CON. Based on the input of the detection signal TFC≠0, the controller CON stops the address incrementing operation of the storage area address generator TAP, and at the same time outputs a control signal R-SEARCH or C-SEARCH.

The control signal R-SEARCH is supplied to the row address generator RAP of the must-repair searching apparatus SER and a first AND gate G1 to start the must-repair searching operation with respect to row addresses. The control signal C-SEARCH is supplied to the column address generator CAP of the must-repair searching apparatus SER and a second AND gate G2 to start the must-repair searching operation with respect to column addresses. When the must-repair searching operation of all the row addresses is completed, the must-repair searching operation of column addresses is performed without exception. The sequence as to which addresses of the row addresses or the column addresses should be searched first can be set in the controller CON in advance.

Regardless of the sequence as to which addresses of the row addresses or the column addresses are searched first, the must-repair searching operations of the row addresses and the column addresses are performed in a pair without exception. Furthermore, as already mentioned above, when a must-repair is detected, the analysis data set in the failure relief analyzer are updated to a state that the detected must-repair has been repaired, i.e., a state that there is no outstanding must-repair. Since, in this updating operation, the number of spare lines to be used for the relief of the must-repair is subtracted from the original number of spare lines, when a must-repair is detected during the must-repair searching operation performed with respect to the other address direction following the one address direction performed immediately before the other address direction, the must-repair searching operation must be performed again with respect to the address direction (the one address direction performed immediately before the other address direction), in which the subtracted number of spare lines is used as a determination value of the must-repair.

Here, a case in which the controller CON first outputs a control signal R-SEARCH will be described.

When the control signal R-SEARCH is outputted (the R-SEARCH is outputted, for example, by changing from logical L to logical H), the row address generator RAP starts its operation, and reads out, from the row address failure number counter/memory RFC, the respective numbers of failure memory cells on all of the row address lines starting from the first row address to the last row address in the storage area specified by the storage area address generator TAP.

The number X1 of failure memory cells on each of the row address lines read out from the row address failure number counter/memory RFC is compared with the number of spare lines provided in the direction orthogonal to the row address line direction. Accordingly, in this case, the number Y1 of the column spare lines SC that are orthogonal to the row address line direction is read out from the column spare line memory SCM of the spare line number storing memory SPM. This number Y1 of the column spare lines SC and the number X1 of failure memory cells on each of the row address lines are inputted to input terminals A and B of the first comparator CP1, respectively, and the number Y1 is compared with the number X1 in the first comparator CP1. If the comparison result is X1≦Y1, the first comparator CP1 outputs a logical L signal, and hence AND gate G1 also outputs a logical L signal. As a result, the controller CON determines that it is not must-repair, and continues to generate the control signal R-SEARCH. Therefore, the row address generator RAP generates the next row address. If a comparison result indicating X1>Y1 does not occur until the last row address is generated, a row must-repair detection signal R-Must Repair is not supplied to the controller CON from the first comparator CP1, and the controller CON deems that there is no must-repair on all of the row address lines when received a carry signal RAP MAX from the row address carry selector CY2, thereby to stop the generation of the control signal R-SEARCH (to change the control signal R-SEARCH from logical H to logical L, for instance) and to output a control signal C-SEARCH in place thereof.

When the control signal C-SEARCH is outputted (When the control signal C-SEARCH is changed from logical L to logical H), the column address generator CAP starts its operation this time, and reads out, from the column address failure number counter/memory CFC, the respective numbers of failure memory cells on all the column address lines starting from the first column address to the last column address in the storage area specified by the storage area address generator TAP. The number of failure memory cells X2 on each of the column address lines read out from the column address failure number counter/memory CFC is compared with the number of spare lines provided in the direction orthogonal to the column address line direction. Therefore, in this case, the number Y2 of the row spare lines SR that are orthogonal to the column address line direction is read out from the row spare line memory SRM of the spare line number storing memory SPM. This number Y2 of the row spare lines SR and the number X2 of the failure memory cells on each column address line are inputted to input terminals A and B of a second comparator CP2, respectively and the number X2 is compared with the number Y2 in the comparator CP2. If the comparison result is X2≦Y2, the comparator CP2 outputs a logical L signal, and hence the AND gate G2 also outputs a logical L signal. As a result, the controller CON determines that the failure state is not must-repair, and continues to output the control signal C-SEARCH. Consequently, the column address generator CAP generates the next column address. If a comparison result indicating X2>Y2 does not occur until the last column address, a column must-repair detection signal C-Must Repair is not supplied from the second comparator CP2 to the controller CON. Therefore, the controller CON considers, upon receiving a carry signal CAP MAX from the column address carry selector CY3, that there is no must-repair on all the column address lines, and the controller CON stops the generation of the control signal C-SEARCH.

However, since the must-repair detection signal is not supplied from both of the first and second comparators CP1 and CP2, the controller CON supplies a control signal TAP INC to the storage area address generator TAP to make the storage area address generator TAP increment by one the address being outputted therefrom and output a storage area address signal for specifying the next storage area so that the control is moved to the failure relief analyzing operation (in this case, the must-repair searching operation) of the next storage area.

When any must-repair detection signal is generated from both of the first and second comparators CP1 and CP2 in the must-repair searching operation for each storage area, the above operation is repeated. However, if the controller CON has received a carry signal TAP MAX from the storage area carry selector CY1, the controller CON supplies a control signal TAP INC to the storage area address generator TAP to make the storage area address generator TAP increment by one the address being outputted therefrom and output a storage area address signal for specifying the last storage area so that the failure relief analyzing operation of the last storage area is performed. After that, however, even if any must-repair detection signal is generated from both of the first and second comparators CP1 and CP2, the controller CON.does not output the control signal TAP INC.

On the contrary, if a comparison result X1>Y1 or X2>Y2 (a state that the number of failure memory cells X1 or X2 is greater than the number of spare lines Y1 or Y2) is detected in either of the comparator CP1 or CP2, a detection signal R-Must Repair or C-Must Repair is sent to the controller CON. As a result, the controller CON determines that there is a must-repair, and gets into the updating operation of the data set in the failure relief analyzer.

For example, if the first comparator CP1 detects that there is a must-repair on a certain row address line (X1>Y1), a logical H signal is inputted to one input terminal of the AND gate G1 from the comparator CP1. The control signal R-SEARCH is inputted to the other input terminal of the AND gate G1. At this point in time, a must-repair is being searched with respect to row addresses, and therefore the control signal R-SEARCH is logical H. Therefore, the AND gate G1 outputs a logical H signal.

This logical H signal is inputted to an enable terminal EN of a second subtractor DS2 provided in the spare line number storing memory SPM, and the second subtractor DS2 subtracts 1 from the number Y1 of the row spare lines SR stored in the row spare line memory SRM. As a result, the set value in the row spare line memory SRM becomes Y1−1, and therefore the number of row spare lines SR provided in the column address direction COL for the storage area specified by the storage area address generator TAP is updated to the value (Y1−1) that is obtained by subtracting 1 from the initial value. In parallel with this operation, the logical H signal that the AND gate has outputted, is also inputted to the controller CON as a control signal R-Must Repair that represents a row address must-repair. Upon receiving the control signal R-Must Repair, the controller CON outputs a control signal C-DSCAN.

Since this control signal C-DSCAN is supplied to the row address generator RAP via an inverting input terminal of an AND gate, and is inputted to the column address generator CAP via an OR gate, the AND gate of the row address generator outputs a logical L signal. Therefore, when the control signal C-DSCAN is outputted, only the column address generator CAP starts its operation, and the numbers of failure memory cells on all the column address lines stored in the column address failure number counter/ memory CFC are read out. In addition, the control signal C-DSCAN is also inputted to one input terminal of an AND gate G4 of the must-repair searching apparatus SER and respective inverting input terminals of AND gates G5 and G6 of the spare line number storing memory SPM. Therefore, each of the AND gates G5 and G6 outputs a logical L signal that represents a numerical value "0". A numerical value that represents the number of row spare lines SR stored in the row spare line memory SRM is applied to the non-inverting terminal of the AND gate G5. Therefore, when the control signal C-DSCAN is not inputted to the AND gate G5, the AND gate G5 outputs this numerical value. In addition, a numerical value that represents the number of column spare lines SC stored in the column spare line memory SCM is applied to the non-inverting terminal of the AND gate G6. Therefore, when the control signal C-DSCAN is not inputted to the AND gate G6, the AND gate G6 outputs this numerical value.

When the AND gate G5 outputs a numerical value "0", this numerical value "0" is inputted to an input terminal A of the second comparator CP2. As a result, the second comparator CP2 outputs a logical H signal if the number of failure memory cells on each column address read out from the column address failure number counter/memory CFC is a numerical value other than "0".

The logical H signal outputted from the second comparator CP2 is supplied to another input terminal of an AND gate G4 having three inputs. Since a data read out from the failure analysis memory 118 is supplied to the remaining input terminal of the AND gate G4, the AND gate G4 outputs a logical H signal whenever the number of failures on a column address line on which at least one failure memory cell is present is read out and a data read out from the failure analysis memory 118 is a logical "1" representing a failure memory cell. This logical H signal is inputted, via an OR gate OR, to the respective enable input terminals EN of the first subtractor DS1, the fourth subtractor DS4 and the fifth subtractor DS5. Therefore, these subtractors DS1, DS4 and DS5 subtract Is from the total failure number counter/ memory TFC, the row address failure number counter/ memory RFC and the column address failure number counter/memory CFC, respectively. As a result, the number of failures stored in these counters/memories TFC, RFC and CFC are updated to values obtained by subtracting 1s from the values that were previously stored therein, respectively.

Figure 3:
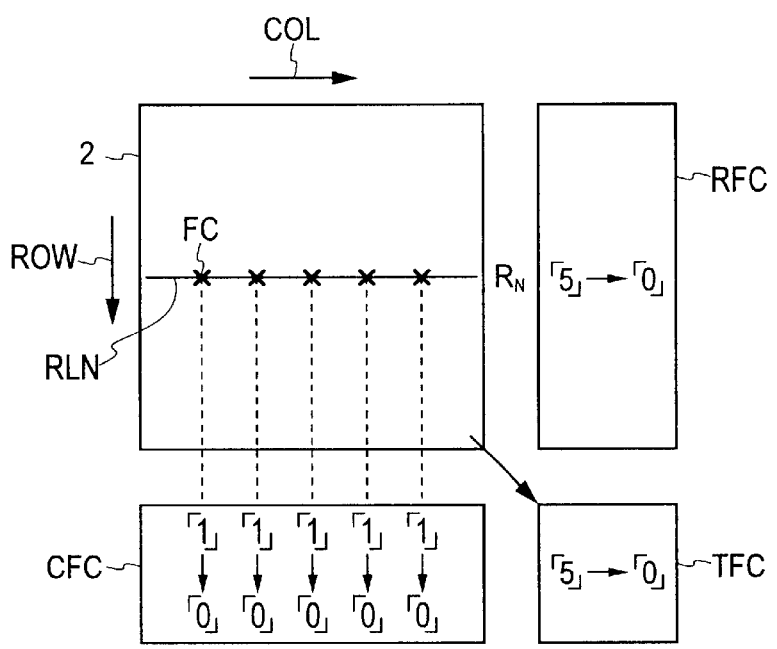
FIG. 3 is a diagram for explaining an example that a must-repair is repaired by use of a method of analyzing a relief of failure cells in a memory according to the present invention.

This state is shown in FIG. 3. As illustrated, assuming that there are five failure memory cells FC present on a row address line RLN having a row address RN in a storage area 2, a numerical value "5" is stored as the number of failure memory cells in the row address RN of the row address failure number counter/memory RFC. On the other hand, in the column address failure number counter/memory CFC, a numerical value "1" is stored as the number of failure memory cells in each of the five column addresses in each of which one of the five failure memory cells FC is present.

When a value stored in the column address failure number counter/memory CFC is read out, the AND gate G4 outputs a logical H signal for each of the five column addresses in each of which a failure memory cell FC is present on the row address line RLN. Therefore, whenever the logical H signal is outputted, the first, the fourth and the fifth subtractors DS1, DS4 and DS5 perform the subtracting operations to update the stored values in the corresponding counters/ memories TFC, RFC and CFC, respectively. In this case, since the AND gate G4 outputs the logical H signal five times, as shown in FIG. 3, the stored value in the total failure number counter/memory TFC is decreased from "5" to "0", the stored value in the row address failure number counter/ memory RFC is also decreased from "5" to "0", and the stored value in each of the corresponding column addresses in the column address failure number counter/memory CFC is decreased from "1" to "0".

When the column address generator CAP generates, in the state that the control signal C-DSCAN is in logical H, a column address signal that indicates the last column address, the column address carry selector CY3 sends a carry signal CAP MAX to the controller CON. Based on this carry signal CAP MAX, the controller CON switches the control signal C-DSCAN to logical L, and instead, the controller CON switches the control signal R-SEARCH to logical H again so that the row address generator RAP increments the row address by one and the must-repair searching operation for the next row address and following row addresses is continued. When the row address generator RAP generates a row address signal that indicates the last row address, the row address carry selector CY2 sends a carry signal RAP MAX to the controller CON. Upon receiving the carry signal RAP MAX, the controller CON finishes the must-repair searching operation in the row address direction ROW.

The controller CON switches, in order to finish the must-repair operation in the row address direction ROW, the control signal R-SEARCH to logical L, and at the same time switches the control signal C-SEARCH to logical H so that the must-repair searching operation in the column address direction COL is performed. This must-repair searching operation in the column address direction COL is performed by comparing the number of failure memory cells on each column address line read out from the column address failure number counter/memory CFC with the number of row spare lines SR stored in the row spare line memory SRM. In this case, the number of row spare lines SR stored in the row spare line memory SRM has been decreased by one, as explained before, because it is considered that one row spare line has been used for relief of the must-repair in the row direction ROW. Therefore, if the initial value is "2", the number of row spare lines SR stored in the row spare line memory SRM is "1". As a result, in the example shown in FIG. 3, when a value read out from the column address failure number counter/memory CFC is larger than "1" in the must-repair searching operation in the column address direction COL, the corresponding column is determined to be in the state of must-repair.

Further, in the example shown in FIG. 3, when the must-repair in the row address direction ROW was detected, the value stored in each of the counters/memories TFC, RFC and CFC was updated to "0" because the failure memory cells of the must-repair were relieved. Therefore, the storage area is now in the state that there is no failure memory cell therein at the must-repair searching operation time in the column address direction COL. As a result, the must-repair searching operation in the column address direction COL is completed without detecting any must-repair.

When the last column address is generated from the column address generator CAP, the column address carry selector CY3 sends a carry signal CAP MAX to the controller CON. Therefore, the controller CON switches the control signal C-SEARCH to logical L to finish the must-repair searching operation in the column address direction COL. At the same time, since the must-repair detection signal is not supplied from both of the first and second comparators CP1 and CP2, the controller CON supplies a control signal TAP INC to the storage area address generator TAP to increment by one the address being generated from the storage area address generator TAP so that a storage area address signal for specifying a next storage area is generated and the control is moved to the failure relief analyzing operation (in this case, a must-repair searching operation) of the next storage area.

Figure 4:
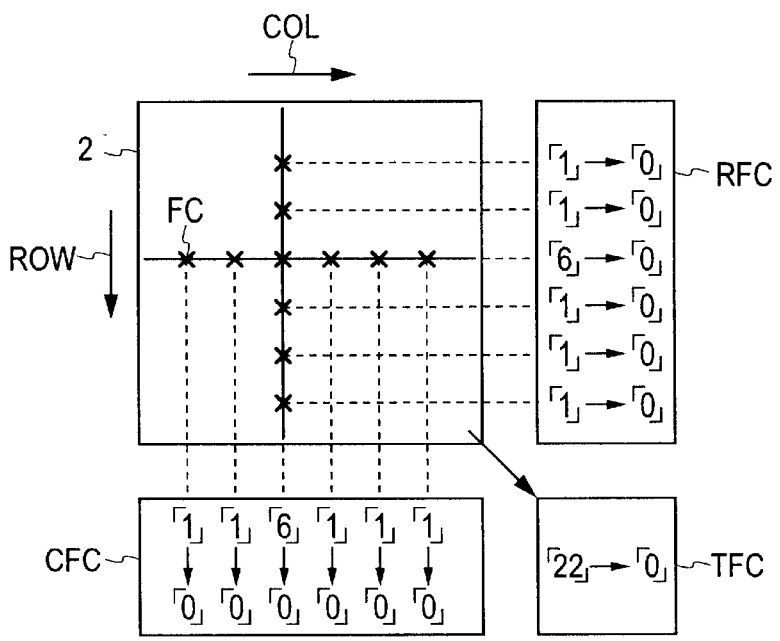
FIG. 4 is a diagram for explaining another example that a must-repair is repaired by use of the method of analyzing a relief of failure cells in a memory according to the present invention.

In the must-repair searching operation of a certain storage area following the above operation, if it is assumed that a must-repair is detected, for example as shown in FIG. 4, in each of the row address direction ROW and the column address direction COL, as already explained with reference to FIG. 3 for the must-repair searching operation in the row address direction ROW, failure memory cells on the row address line RLN are considered to be relieved using one of the row spare lines SR, and the analysis data stored in the three counters/memories TFC, RFC and CFC are updated.

Next, in the must-repair searching operation in the column address direction COL, failure memory cells on the column address line CLN are considered to be relieved using one of the column spare lines SC, and the analysis data stored in the three counters/memories TFC, RFC and CFC are updated (when a control signal R-DSCAN is outputted from the controller CON). In this case, since the number of column spare lines SC is decreased by one, it is necessary to perform again the must-repair searching operation with respect to row addresses in which column spare lines SC are the determination criteria for the must-repair search.

For this reason, if the control signal R-DSCAN is switched to logical H at least once during the must-repair searching operation with respect to column addresses, the controller CON remembers this state, and switches the control signal R-SEARCH to logical H at the time point when the must-repair searching operation with respect to column addresses is completed so that the must-repair searching operation with respect to row addresses is performed again.

If the control signal C-DSCAN is switched to logical H again during the must-repair searching operation with respect to row addresses and the updating operation of the analysis data is performed, the control signal C-SEARCH is switched to logical H again so that the must-repair searching operation with respect to column addresses is performed again. These must-repair searching operations are not performed again after each of the number of row spare lines and the number of column spare lines becomes "0", but are continued until the must-repair searching operation is completed when any must-repair is detected during a time when the must-repair searching operation is performed.

As is apparent from the above description, in the aforementioned embodiment, the failure relief analyzer is constructed such that the total failure number counter/memory TFC is operated in accordance with the address signals generated by the storage area address generator TAP, and the must-repair searching operation is performed only for a storage area having the total number of failure memory cells of other than "0" stored in the total failure number counter/memory TFC, i.e., the must-repair searching operation is not performed for a storage area in which there is no failure memory cell at all. Therefore, the must-repair searching operation of a memory under test having redundancy structure can be performed at high speed.

In addition, even in the case in which the failure relief analyzing operation is performed for a storage area where failure memory cells are present, the total failure number counter/memory TFC, the row address failure number counter/memory RFC and the column address failure number counter/memory CFC operates in accordance with the address signals generated from the storage area address generator TAP, the row address generator RAP and the column address generator CAP, respectively. Therefore, when a must-repair is detected during the must-repair searching operation in the row address direction or the column address direction, a control signal C-DSCAN or R-DSCAN can be outputted at the address position where the must-repair is detected to perform an updating operation of the analysis data. That is, there is no necessity to perform, whenever a must-repair is detected as in the prior art system, the operations of storing the must-repair address in the main controller 111, reading out the stored must-repair address form the main controller 111 after the completion of the must-repair searching operation, and updating the analysis data after setting the read out must-repair address in the failure relief analyzer. Therefore, the must-repair searching operation and the updating operation of the analysis data can be performed at high speed. As a result, the relief analyzing operation can also be performed at high speed from this point of view.

Further, in the aforementioned embodiment, there is explained a case in which the controller CON outputs a control signal R-SEARCH first. However since it is apparent that the failure relief and analyzing operation can also be performed by the method similar to that mentioned above in the case in which a control signal C-SEARCH is outputted first, the explanation thereof will be omitted.

Consequently, according to the present invention, there can be provided a method of analyzing a relief of failure cells and a failure relief analyzer that can complete in short time the failure relief analysis even for a memory having many storage areas. In addition, if the failure relief analyzer constructed as mentioned above is integrated into a memory testing apparatus, the test time of an entire memory can be decreased.

While the present invention has been described with regard to the preferred embodiments shown by way of example, it will be apparent to those skilled in the art that various modifications, alterations, changes, and/or minor improvements of the embodiments described above can be made without departing from the spirit and the scope of the present-invention. Accordingly, it should be understood that the present invention is not limited to the illustrated embodiments, and is intended to encompass all such modifications, alterations, changes, and/or minor improvements falling within the scope of the invention defined by the appended claims.

What is claimed is:

1. A method of analyzing a repair of failure cell in a memory comprising the steps of:

testing a memory having a plurality of storage areas and a plurality of spare lines for relieving failures in said storage areas, and storing in a failure memory cell storage an indication of failure memory cells in the storage areas;

counting for each of the storage areas a number of failure memory cells for each row address, a number of failure memory cells for each column address, and a total number of failure memory cells by accessing each memory cell of the failure memory cell storage once;

storing the counted numbers as stored data;

detecting whether or not the number of failure memory cells for a row or column address of each of the storage areas is greater than a number of spare lines available for relieving a failure;

determining a set of failure memory cells to be must-repair when the number of failure memory cells is greater than the number of spare lines available for relieving the set of failure memory cells;

updating the stored data and the number of spare lines available for relieving a failure to show said must-repair has been repaired; and resuming a search in said failure memory cell storage for a must-repair condition.

2. A memory testing apparatus for testing a memory having a plurality of storage areas and a plurality of spare lines for relieving failures in said storage areas, and storing in a failure memory cell storage of a failure relief analyzer an indication of failure memory cells in the storage areas, said failure relief analyzer comprising:

means for counting, for each of the storage areas, a number of failure memory cells for each row address, a number of failure memory cells for each column address, and a total number of failure memory cells by accessing each memory cell of the failure memory cell storage once;

a failure memory cell number storage that stores the counted numbers as stored data;

an analyzed storage area detector for searching whether a failure memory cell exists in each storage area and determining whether a respective storage area is a storage area for which a failure relief analysis should be carried out;

a spare line number memory for storing a number of spare lines available for repair, said spare line memory storing for each storage area a number of spare lines provided in row address direction and a number of spare lines provided in column address direction;

a must-repair searching apparatus for comparing the number of spare lines stored in said spare line number memory with the number of failure memory cells for a row address line or for a column address line of each storage area, detecting a state that a number of failure memory cells is greater than the number of spare lines provided in a direction orthogonal to the address line and determining the detected state to be a must-repair;

data updating apparatus for carrying out, each time said must-repair searching apparatus detects a must-repair, a process of updating the stored data and the number of spare lines to indicate failure memory cells on the address line of the detected must-repair have been repaired by use of one of the spare lines;

a re-starting apparatus for detecting the end of the data updating process carried out by said data updating apparatus and re-starting said must-repair searching apparatus;

must-repair search resuming means for detecting the fact that said data updating apparatus has operated and for causing a search of must-repair to be resumed, under a condition that the number of spare lines updated by the data updating apparatus is used in detecting a must-repair; and search ending means for detecting the fact that no must-repair is detected and for ending the search of a must-repair for the storage area being analyzed.

3. The memory testing apparatus as set forth in claim 2, wherein said analyzed storage area detector comprises:

a storage area address generator for generating addresses given to said plurality of storage areas;

a total failure number counter/memory for storing the total number of failure memory cells for each storage area, said total failure number counter/memory being accessed by a storage area address signal outputted from said storage area address generator and outputting the total number of failure memory cells of the corresponding storage area;

zero detecting means detecting the fact that the total number of failure memory cells read out of said total failure number counter/memory is "0";

means incrementing the address outputted from said storage area address generator each time said zero detecting means detects "0"; and means starting said must-repair searching apparatus in case that the total number of failure memory cells read out of said total failure number counter/memory is a numerical value other than "0".

4. The memory testing apparatus as set forth in claim 2, wherein said spare line number storing memory comprises: a memory for storing the number of spare line provided in the row address direction; and a memory for storing the number of spare line provided in the column address direction, said memories being accessed by a storage area address signal outputted from said storage area address generator and outputting the number of spare line prepared on the corresponding storage area, respectively.

5. The memory testing apparatus as set forth in claim 2, wherein said must-repair searching apparatus comprises:
- a row address failure number counter/memory for storing the number of failure memory cells on each row address line for each storage area;
- a column address failure number counter/memory for storing the number of failure memory cells on each column address line for each storage area;
- a row address generator for accessing said row address failure number counter/memory;
- a column address generator for accessing said column address failure number counter/memory;
- a first comparator for comparing the number of failure memory cells on each row address line read out of said row address failure number counter/memory with the number of spare line provided in orthogonal direction to the row address line and detecting a must-repair on the row address line; and
- a second comparator for comparing the number of failure memory cells on each column address line read out of said column address failure number counter/memory with the number of spare line provided in orthogonal direction to the column address line and detecting a must-repair on the column address line.

6. The memory testing apparatus as set forth in claim 2, wherein said data updating apparatus comprises:
- a controller for performing a control which prevents said row address generator or column address generator under incrementing operation from doing the incrementing operation, and a control which increments said column address generator or row address generator having paused in operation from the first address to the last address, during a search of a must-repair by a detection signal that said must-repair searching apparatus has detected either one of a must-repair on a row address line or a must-repair on a column address line;
- a first subtracter for updating the number of spare line by assuming that one spare line has been used for relieving the detected must-repair and setting the updated number of spare line in said memory for storing the number of spare lines;
- a second subtracter for performing a subtraction of "1" from the total number of failure memory cells of the corresponding storage area outputted from said total failure number counter/memory each time a failure memory cell is read out from said row address failure number counter/memory or column address failure number counter/memory read out by the incrementing operation of said row address generator or column address generator which has started to do its incrementing operation, and setting the result of the subtraction in said total failure number counter/memory; and
- third and fourth subtracters for performing a subtraction of "1" from the number of failure memory cells of the corresponding storage area outputted respectively from said row address failure number counter/memory and said column address failure number counter/memory each time a failure memory cell is read out respectively from said row address failure number counter/memory and column address failure number counter/memory, and setting the result of the subtractions in said row address failure number counter/memory and said column address failure number counter/memory, respectively.

7. The memory testing apparatus as set forth in claim 2, wherein said re-starting apparatus comprises:
- a pair of carry selectors for detecting the facts that the row address signal and column address signal outputted respectively from said row address generator and said column address generator have reached their last addresses, respectively; and
- a controller receiving carry signals outputted from these carry selectors and performing a control which resumes the incrementing operation of said row address generator or said column address generator having paused in operation.

8. The memory testing apparatus as set forth in claim 2, wherein said must-repair search resuming means comprises: control means for performing a control which detects a coincidence between the condition that said must-repair searching apparatus detects the presence of a must-repair on either one of the row address direction or column address direction, and said data updating apparatus operates to update the number of spare line stored in said memory for storing the number of spare lines and the condition that the search operation for a must-repair has completed, and causing a search operation for a must-repair on the one address direction using the updated number of spare line as the detecting condition of a must-repair to be executed.

9. The memory testing apparatus as set forth in claim 2, wherein said search ending means comprises: means detecting a completion of two conditions that the address generated from said storage area address generator has reached the last address and that said must-repair searching apparatus has ended the search operation for a must-repair on the row address direction or column address direction without detecting any must-repair.

* * * * *